United States Patent
Gao et al.

(10) Patent No.: US 9,787,264 B2
(45) Date of Patent: Oct. 10, 2017

(54) CONFIGURABLE TRANSCEIVER CIRCUIT ARCHITECTURE

(71) Applicant: Intel Corporation, Santa Clara, CA (US)

(72) Inventors: Miaobin Gao, Saratoga, CA (US); Christine M. Krause, Santa Cruz, CA (US); Hiu-Chin Wu, Cupertino, CA (US); Hengju Cheng, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/038,440

(22) PCT Filed: Dec. 20, 2013

(86) PCT No.: PCT/US2013/077310
§ 371 (c)(1),
(2) Date: May 20, 2016

(87) PCT Pub. No.: WO2015/094376
PCT Pub. Date: Jun. 25, 2015

(65) Prior Publication Data
US 2016/0301372 A1    Oct. 13, 2016

(51) Int. Cl.
*H03F 3/45*        (2006.01)
*H04B 3/02*        (2006.01)
(Continued)

(52) U.S. Cl.
CPC ......... *H03F 3/45475* (2013.01); *H01L 23/48* (2013.01); *H03F 1/34* (2013.01);
(Continued)

(58) Field of Classification Search
CPC ........... H01L 23/48; H01L 2224/48091; H01L 2224/48137; H01L 2924/0002; H03F 1/34;
(Continued)

(56) References Cited

U.S. PATENT DOCUMENTS

| 4,346,312 | A |   | 8/1982 | Christopherson |
| 5,418,492 | A | * | 5/1995 | Wang ................. H03F 3/45103 330/260 |

(Continued)

FOREIGN PATENT DOCUMENTS

JP         2002044035         2/2002

OTHER PUBLICATIONS

"PCT, International Search Report and Written Opinion of the International Searching Authority for International Application No. PCT/US2013/077310", (Sep. 26, 2014), Whole Document.

(Continued)

*Primary Examiner* — Alexander H Taningco
*Assistant Examiner* — Kurtis R Bahr
(74) *Attorney, Agent, or Firm* — Blakely, Sokoloff, Taylor & Zafman LLP

(57) ABSTRACT

Techniques and mechanisms for providing signal communication with a configurable transceiver circuit. In an embodiment, an integrated circuit comprises transceiver circuitry including an output stage and current mirror circuitry. The output stage is coupled to receive a differential signal pair and to provide at least one output signal based on the differential signal pair. In another embodiment, configuration logic is operable to select between a first mode and a second mode of the transceiver circuit. The first mode includes the current mirror circuitry being disabled from providing a current signal to the output stage, and a first circuit path being closed to provide voltage to the output (Continued)

stage. The second mode includes the first circuit path being open and the current mirror circuitry being enabled to provide a current signal to the output stage.

17 Claims, 7 Drawing Sheets

(51) Int. Cl.
*H01L 23/48* (2006.01)
*H03F 1/34* (2006.01)
*H03F 3/08* (2006.01)

(52) U.S. Cl.
CPC ......... *H03F 3/087* (2013.01); *H03F 3/45183* (2013.01); *H04B 3/02* (2013.01); *H01L 2224/48091* (2013.01); *H01L 2224/48137* (2013.01); *H01L 2924/0002* (2013.01); *H03F 2203/45112* (2013.01); *H03F 2203/45206* (2013.01); *H03F 2203/45288* (2013.01); *H03F 2203/45528* (2013.01); *H03F 2203/45641* (2013.01); *H03F 2203/45646* (2013.01); *H03F 2203/45674* (2013.01); *H03F 2203/45702* (2013.01); *H03F 2203/45726* (2013.01); *H03F 2203/45732* (2013.01)

(58) Field of Classification Search
CPC ....... H03F 3/45475; H03F 2203/45112; H03F 2203/45228; H04B 3/02
USPC .................................................. 326/112, 115
See application file for complete search history.

(56) References Cited

U.S. PATENT DOCUMENTS

| | | | |
|---|---|---|---|
| 5,656,954 A * | 8/1997 | Kondoh | H03K 3/0231 326/115 |
| 6,771,105 B2 | 8/2004 | Andrasic et al. | |
| 6,982,559 B2 | 1/2006 | Taylor | |
| 7,209,502 B2 * | 4/2007 | Brosnan | H01S 5/042 345/166 |
| 7,215,199 B2 * | 5/2007 | Marholev | H03F 3/45183 330/257 |
| 7,652,528 B2 * | 1/2010 | Ballarin | H03G 1/04 330/282 |
| 7,884,658 B2 * | 2/2011 | Kinget | H03K 3/356043 326/112 |
| 2002/0109493 A1 * | 8/2002 | Hall | G05F 3/242 323/316 |
| 2003/0160749 A1 * | 8/2003 | Tsuchi | G09G 3/2011 345/87 |
| 2004/0022544 A1 | 2/2004 | Case et al. | |
| 2008/0084113 A1 * | 4/2008 | Iwasaki | H03K 19/018528 307/34 |
| 2013/0197920 A1 * | 8/2013 | Lesso | H04L 25/4902 704/500 |

OTHER PUBLICATIONS

International Preliminary Report on Patentability PCT Application No. PCT/US2013/077310 mailed Jun. 30, 2016, 9 pages.

* cited by examiner

US 9,787,264 B2

CONFIGURABLE TRANSCEIVER CIRCUIT ARCHITECTURE

CROSS-REFERENCE TO RELATED APPLICATION

This patent application is a U.S. National Phase Application under 35 U.S.C. §371 of International Application No. PCT/US2013/077310, filed Dec. 20, 2013, entitled CONFIGURABLE TRANSCEIVER CIRCUIT ARCHITECTURE.

BACKGROUND

1. Technical Field

Embodiments discussed herein pertain generally to data communication systems. More particularly, certain embodiments relate generally to a configurable transceiver circuit.

2. Background Art

Network communications have dramatically increased access to data, enabling larger and larger volumes of data to be transmitted. In order to facilitate the ever-increasing demand for data throughput, communications systems have had to progressively increase their bandwidth. For example, developers of Ethernet network technology have previously provided standards for transfer rates of 10 megabits/second, 100 megabits/second, and 1 gigabit/second. More recently, technology for 10 gigabit/second Ethernet communication has been widely adapted.

To support such higher bandwidth signaling, gigabit/second networks generally require optical fiber cabling, which provides several advantages over copper cabling. A fiber optic connection provides two functions: it couples a transmitter light signal produced by an emitter to the fiber optic cabling, and it provides a means for coupling a received light signal on the fiber optic cable to a receiving component, typically comprising a detector.

Notwithstanding the speed advantages of optical signaling, electrical communications via copper, twisted pair, coaxial cable or other such media—for various technical and/or economic reasons—continue to provide a relatively more efficient solution for many applications. Consequently, successive generations of consumer electronics continue to scale with respect to increasingly diverse communication and computing capabilities which, increasingly, include one or both of optical signaling capability and electrical signaling capability. As a result, there is an attendant increase in the need to provide components which are readily adaptable to support diverse signaling applications.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Embodiments discussed herein variously provide for an integrated circuit to be available for operation in any of a variety of applications including an optical communication application and one or more electrical signaling applications. For example, an integrated circuit according to an embodiment, may comprise transceiver circuitry including an output stage and current mirror circuitry. The output stage may be coupled to receive a differential signal pair and to provide at least one output signal to represent information of the differential signal pair.

In an embodiment, configuration logic included in or coupled to the transceiver circuitry may be operable to select between a plurality of operational modes including, for example, a first mode corresponding to one or more types of electrical communication and a second mode corresponding to optical communications. Such operational modes may variously facilitate operation of the transceiver circuitry each in a corresponding configuration of the transceiver circuitry with respect to other input/output (I/O) hardware. By way of illustration and not limitation, the first mode may include the current mirror circuitry being disabled from providing a current signal to the output stage. The first mode may also include a first circuit path being closed for voltage to be provided to the output stage independent of the current mirror circuitry. Alternatively or in addition, the second mode may include the current mirror circuitry being enabled to provide a current signal to the output stage—e.g. wherein the first circuit path is open to prevent the voltage from being provided to the output stage independent of the current mirror circuitry.

Figure 1A:
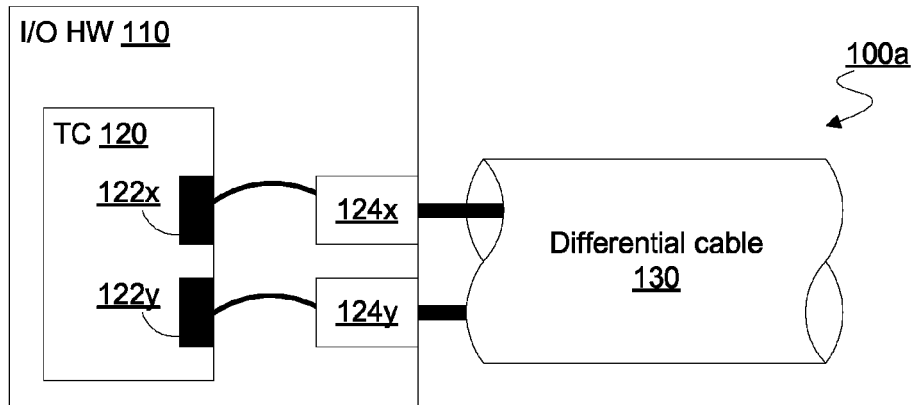
FIGS. 1A-1C are functional block diagrams each illustrating elements of a respective system for processing a differential signal pair according to a corresponding embodiment.
Figure 1B:
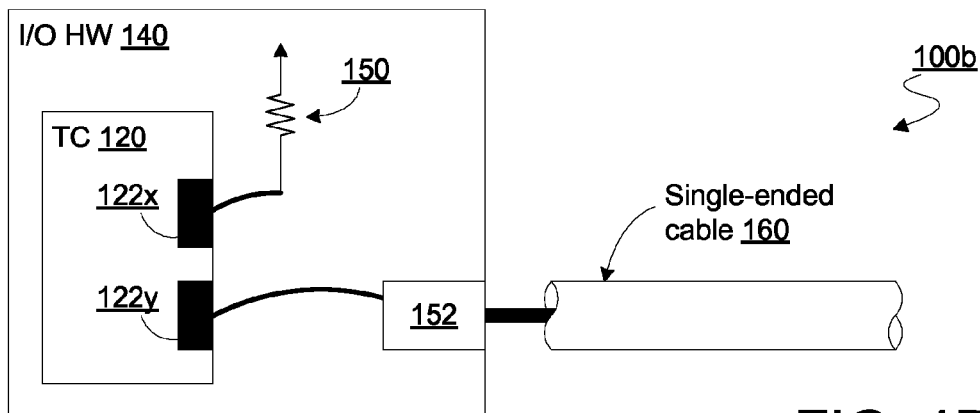
Figure 1C:
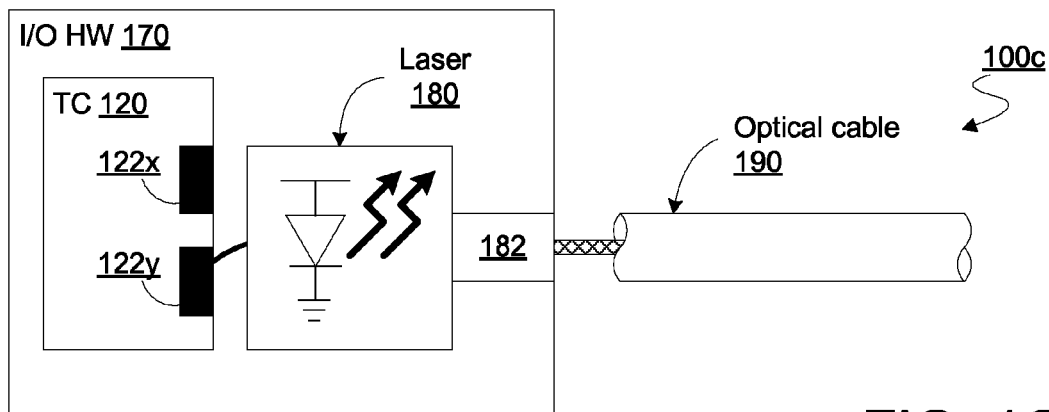

FIGS. 1A-1C illustrate how configurable transceiver circuitry according to an embodiment may be variously adapted for operation in any of a variety of applications which include, for example, an optical signaling application and an electrical signaling application.

FIG. 1A illustrates elements of a system 100a according to an embodiment in which a transceiver circuit TC 120 is coupled and/or otherwise configured to facilitate communication of a differential signal. In an embodiment, system 100a includes input/output (I/O) hardware 110 and a differential cable 130, where contacts 124x, 124y of I/O hardware 110 are to couple to different respective signal lines of differential cable 130. Although certain embodiments are not limited in this regard, contacts 124x, 124y may be capable of manual disconnection from (and/or manual reconnection to) differential cable 130.

I/O hardware 110 may operate as an input and/or output interface which is included in, or is to couple to, any of a variety of consumer electronic devices including, but not limited to, a laptop computer, a desktop computer, handheld device (e.g. a smart phone or tablet), a server, a gaming or entertainment control system, a scanner, copier, printer, or other electronic device. In some embodiments, I/O hardware 110 may be integrated into an interconnect device which is to couple to such a consumer electronic device. For example, I/O hardware 110 may be integrated into a connector housing at a terminal end of a cable device. Such a cable device may include I/O hardware at each of it terminal ends—e.g. including I/O hardware 110 at one terminal end and other I/O hardware at the other terminal end to perform signal processing which is reciprocal to that performed with I/O hardware 110.

I/O hardware 110 may comprise TC 120—e.g. where I/O hardware 110 includes a printed circuit board (PCB) coupled to TC 120. For example, TC 120 may comprise a packaged circuit device which is flip-chip attached or otherwise coupled to a PCB of I/O hardware 110. Alternatively, I/O hardware 110 may be or include a packaged circuit device, where TC 120 is one of multiple IC die of such a packaged circuit device. I/O hardware 140 may generate or otherwise provide to TC 120 an input differential signal pair representing information to be communicated from I/O hardware 110 via differential cable 130. TC 120 may include circuit logic configured to retime, convert, amplify and/or otherwise condition such an input differential signal pair to generate another resulting differential signal which TC 120 is to output to one or more other components of I/O hardware 110.

For example, TC 120 may include a contact 122x, where a first signal of the resulting differential signal pair is to be sampled, output or otherwise provided at contact 122x. In an embodiment, contact 122x is coupled to provide the first signal directly or indirectly to a contact 124x of I/O hardware 110. TC 120 may further comprise another contact 122y, where a second signal of the resulting differential signal pair (concurrent with the first signal) is to be sampled, output or otherwise provided at contact 122y. Contact 122y may be coupled to provide the second signal directly or indirectly to a contact 124y of I/O hardware 110—e.g. where contacts 124x, 124y couple to different respective signals lines of differential cable 130. In an embodiment, contacts 122x, 122y, 124x, 124y each include any of a via, trace, pin, pad, ball or other such conductive structure for signal communication.

In system 100a, an operational mode of TC 120 is configured to support the transmission of a differential signal pair via contacts 122x, 122y. Such an operational mode may be one of a plurality of possible operational modes for which TC 120 is capable of being configured. As discussed herein, configuration of TC 120 to facilitate differential signal communications via contacts 122x, 122y may include disabling a functionality of TC 120 which is for another type of signal communication with contact 122x and/or contact 122y. For example, differential signaling with TC 120 may be based on a configuration which disables functionality which might otherwise be available to facilitate optical signaling.

Although certain embodiments are not limited in this regard, TC 120 may further comprise receiver circuitry which is to convert or otherwise process one or more signals received by I/O hardware 140. Such receiver circuitry of TC 120 may be configurable, for example, to facilitate one or more of differential signal communication, single-ended signal communication and optical signal communication. Such other signal communications may be received by I/O hardware 110 via additional or alternative transmission media which, for example, is integrated in differential cable 130 or (alternatively) is distinct from differential cable 130.

By way of illustration and not limitation, I/O hardware 110 may include switching, multiplexing or other such logic to transition between transmitting differential signals with contacts 124x, 124y and receiving differential signals with contacts 124x, 124y. In one embodiment, contacts 122x, 122y may be communicatively isolated from contacts 124x, 124y during a period of time when I/O hardware 110 is to receive signals via contacts 124x, 124y. For example, during such a period of time, contacts 124x, 124y may instead be communicatively coupled to one or more other contacts (not shown) of TC 120. Certain embodiments are not limited to particular techniques and/or mechanisms for variously coupling contacts 124x, 124y at different times to different contacts of TC 120. Such techniques and/or mechanisms may be adapted, for example, from conventional communication practices for duplex communication, the details of which are not set forth herein to avoid obscuring features of certain embodiments.

In an embodiment, I/O hardware 110 includes additional circuitry (not shown) which is included in or coupled to TC 120. For example, I/O hardware 110 may include digital-to-analog (D/A), pre-driver and/or other circuitry to generate a differential signal pair to be provided to driver circuitry of TC 120. Alternatively or in addition, I/O hardware 110 may include analog-to-digital (A/D) circuitry to process a differential signal pair received via differential cable 130.

FIG. 1B illustrates elements of a system 100b according to another embodiment in which a configurable transceiver circuit is instead configured to facilitate single-ended signal communication. System 100b includes I/O hardware 140 and a single-ended cable 160, where a contact 152 of I/O hardware 140 is coupled to a signal line of single-ended cable 160. Although certain embodiments are not limited in this regard, single-ended cable 160 may be capable of manual disconnection from and/or manual reconnection to I/O hardware 140. Alternatively, one or more signal lines of single-ended cable 160 may be wire-bonded or otherwise fixedly coupled to I/O hardware 140.

I/O hardware 140 may include one or more features of I/O hardware 110, for example. To illustrate certain features of various embodiments, I/O hardware 140 is shown as including TC 120. Of contacts 122x, 122y, only one such contact may be coupled in system 100b to communicate a signal via single-ended cable 160. For example, in order to facilitate the single-ended use case, only one of contacts 122x, 122y of TC 120 may be coupled to an external I/O contact of I/O hardware 140. In such an embodiment, the other one of contacts 122x, 122y may be coupled to a termination load to facilitate single-ended signal communication.

By way of illustration and not limitation, contact 122y may be coupled directly or indirectly to contact 152 of I/O hardware 140, where a signal is to be output at contact 122y based on a differential signal pair received by driver circuitry of TC 120. The signal output at 122y may be provided to contact 152 for transmission as a single-ended communication via single-ended cable 160. By contrast, contact 122x may be coupled to a resistor 150 which provides a termination load to facilitate such single-ended communication using contact 122y.

In system 100b, an operational mode of TC 120 is configured to support the transmission of a single-ended signal—e.g. via one of contact 122y. As discussed herein, configuration of TC 120 to facilitate single-ended communications may include disabling a functionality of TC 120 which is for another type of signal communication with contact 122x and/or contact 122y. For example, single-ended signaling with TC 120 may be based on a configuration which disables functionality otherwise available to facilitate optical signaling with TC 120.

I/O hardware 140 may further include switching, multiplexing or other such logic (not shown) to transition between transmitting a signal with contact 152 and receiving another signal with contact 152. In one embodiment, contact 122y may be communicatively isolated from contact 152 during a period of time when I/O hardware 140 is to receive a signal via contact 152. For example, during such a period of time, contact 152 may instead be coupled to one or more other contacts (not shown) of TC 120. Similar to I/O hardware 110, certain embodiments are not limited with respect to particular techniques and/or mechanisms for variously communicatively coupling contact 152 at different times to different contacts of TC 120.

FIG. 1C illustrates elements of a system 100c according to another embodiment in which a configurable transceiver circuit is instead configured to facilitate optical signal communication. System 100c includes I/O hardware 170 and an optical cable 190, where an optical coupler 182 (e.g. including a waveguide, mirror, lens and/or other optics) of I/O hardware 170 is coupled to an optic fiber of optical cable 190. Although certain embodiments are not limited in this regard, optical cable 190 may be capable of manual disconnection from and/or manual reconnection to I/O hardware 170. Alternatively, optical cable 190 may be fixedly coupled to I/O hardware 170.

I/O hardware 170 may include one or more features of I/O hardware 110, for example. To illustrate certain features of various embodiments, I/O hardware 170 is shown as including TC 120. Of contacts 122x, 122y, only one such contact may be coupled in system 100c for implementing communications with optical cable 190. For example, in order to facilitate the optical signaling use case, only one of contacts 122x, 122y of TC 120 may be coupled to provide a signal to any I/O mechanism of I/O hardware 170.

By way of illustration and not limitation, contact 122y may be coupled via a laser 180 to optical coupler 182 of I/O hardware 170, where a signal is to be output at contact 122y based on a differential signal pair received by driver circuitry of TC 120. The signal output at 122y may be provided to drive laser 180. In response to the signal at 122y, laser 180 may generate laser light which is directed via optical coupler 182 for transmission as an optical communication in optical cable 190.

In system 100c, an operational mode of TC 120 is configured to support the operation of laser 180 based on a signal at one of contacts 122x, 122y. As discussed herein, configuration of TC 120 to facilitate optical communications include disabling a functionality of TC 120 which is would otherwise facilitate electrical communications with contact 122x and/or contact 122y. For example, single-ended signaling with TC 120 may be based on a configuration which disables functionality which might otherwise be available to facilitate single-ended and/or differential signaling.

In an embodiment, I/O hardware 170 further includes switching, multiplexing or other such logic (not shown) to transition between transmitting a signal with optical coupler 182 and receiving another signal with optical coupler 182. In one embodiment, contact 122y may be communicatively isolated from optical coupler 182 during a period of time when I/O hardware 170 is to receive a signal via optical coupler 182. For example, during such a period of time, optical coupler 182 may instead be coupled via a photodetector (not shown) to one or more other contacts of TC 120. Similar to I/O hardware 110, certain embodiments are not limited with respect to particular techniques and/or mechanisms for variously coupling optical coupler 182 at different times to different contacts of TC 120.

Figure 2B:
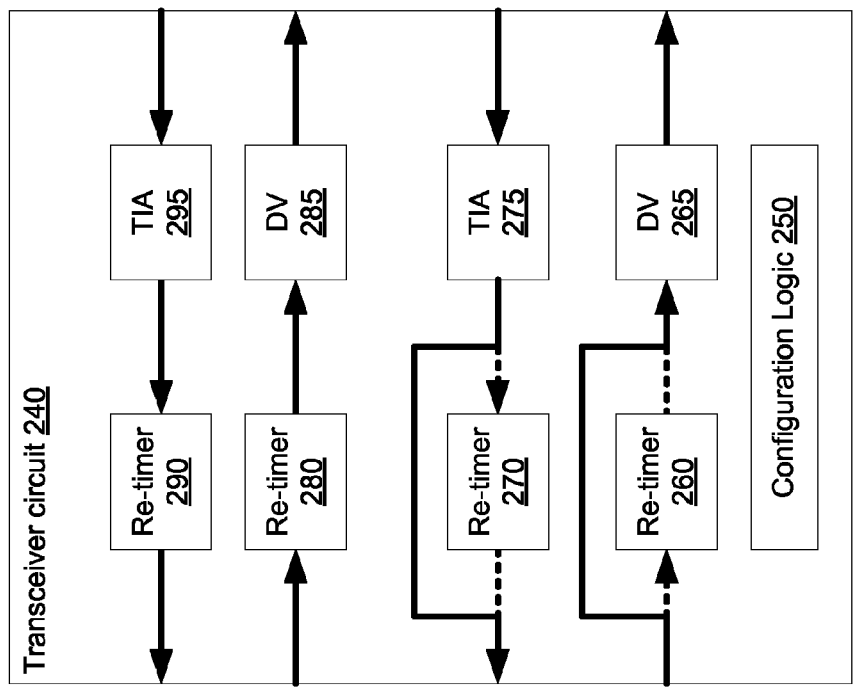
FIGS. 2A, 2B are functional block diagrams each illustrating elements of a respective transceiver circuit for implementing signal processing according to an embodiment.
Figure 2A:
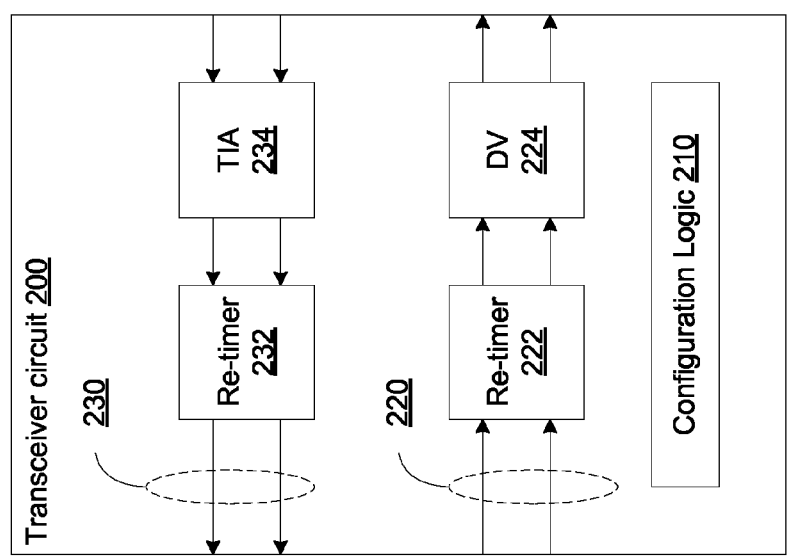

FIG. 2A illustrates elements of a transceiver circuit 200 for processing a differential signal according to an embodiment. Transceiver circuit 200 may be configurable for any of a plurality of operational modes, where each of the operational modes corresponds to a respective type of signaling. For example, transceiver circuit 200 may include some or all of the features of TC 120.

In an embodiment, transceiver circuit 200 includes driver circuitry DV 224 to receive a first differential signal pair, where, based on a configuration of transceiver circuit 200, DV 224 is to generate one of another differential signal pair, a single-ended signal and a drive signal to operate a laser for generating an optical signal. By way of illustration or not limitation, transceiver circuit 200 may include re-timer circuitry 222 to receive a differential input 220. Re-timer circuitry 222 may recover a clock signal and retime data from differential input 220, where such retiming results in an intermediary differential pair provided to DV 224. Whether and/or how re-timer circuitry 222 is to retime data of differential input 220 may depend, for example, on whether transceiver circuit 200 is configured for a particular type of electrical or optical communication. Operation of re-timer circuitry 222 may be adapted from conventional re-timing techniques and/or mechanisms, which are not limiting on certain embodiments. Such conventional techniques and/or mechanisms are not detailed herein to avoid obscuring certain features of various embodiments. In another embodiment, transceiver circuit 200 does not include re-timer circuitry 222—e.g. where differential input 220 is provided directly to DV 224.

Different nodes of DV 224 may be available each to provide a respective signal for transceiver circuit 200 to output. Configuration of DV 224 and/or a coupling of DV 224 to other I/O circuit logic (not show) external to transceiver circuit 200 may determine whether and/or how such signals may be output by transceiver 200—e.g. to determine whether and/or how electrical signal communication or optical signal communication is to be implemented with transceiver circuit 200. For example, transceiver circuit 200 may include configuration logic 210 to implement a configuration of DV 224. Configuration logic 210 may include a micro-controller, state machine, or other such circuitry configured to implement a configuration control functionality. Alternatively or in addition, configuration logic 210 may include one or more switches, fuses and/or other circuit elements to be variously operated by such control functionality.

Configuration logic 210 may receive or otherwise determine one or more signals indicating an operational mode of transceiver circuit 200—e.g. where such an operational mode includes a configuration of DV 224. In response to such one or more signals, configuration logic 210 may variously set respective configuration states of one or more circuit elements which are included in or coupled to DV 224. For example, configuration logic 210 may variously operate one or more switches, fuses and/or other components to selectively enable functionality of DV 224 and/or disable functionality of DV 224. Alternatively or in addition, configuration logic 210 may implement one or more other configuration states of transceiver circuit 200. For example, configuration logic 210 may configure one or more components (not shown) for differential input 220 to bypass re-timer 222.

Although certain embodiments are not limited in this regard, transceiver circuit 200 may further comprise receiver circuitry—represented by the illustrative trans-impedance amplifier (TIA) 234 and re-timer circuitry 232—to facilitate generation of a differential signal pair 230 based on one or more signals received by transceiver circuit 200. In an embodiment, a configuration of such receiver circuitry and/or a coupling of such receiver circuitry to other I/O circuit logic (not show) external to transceiver circuit 200 may determine whether and/or how differential signal pair 230 is to be generated based on another differential signal pair, a single-ended (electrical) signal, or an output from a photodetector based on a received optical signal. For example, configuration logic 210 may configure one or more components (not shown) for TIA 234 to bypass re-timer 232—e.g. where TIA 234 directly outputs differential signal pair 230. Whether and/or how re-timer circuitry 232 is to generate differential signal pair 230 may depend, for example, on whether transceiver circuit 200 is configured (e.g. with other I/O hardware) for a particular type of electrical or optical communication.

FIG. 2B illustrates elements of a transceiver circuit 240 for processing a differential signal pair according to an embodiment. Transceiver circuit 240 may include respective transmit circuitry and respective receive circuitry for each of a plurality of signal lanes. In an embodiment, transceiver circuit 240 includes some or all of the features of transceiver circuit 200.

Transceiver circuit 240 may include transmit circuitry—represented by the illustrative DV 265 and re-timer circuitry 260—configured to generate one or more output signals for a first transmit lane. Transceiver circuit 240 may further comprise receive circuitry—represented by the illustrative TIA 275 and re-timer circuitry 270—configured to generate a differential signal pair based on one or more signals form a first receive lane. Re-timer circuitry 260, 270, DV 265 and TIA 275 may provide the respective functionality of re-timer circuitry 222, 232, DV 224 and TIA 234, for example.

In an embodiment, transceiver circuit 240 includes additional transmit circuitry—represented by the illustrative DV 285 and re-timer circuitry 280—configured to generate one or more output signals for a second transmit lane, and additional receive circuitry (e.g. including the illustrative TIA 295 and re-timer circuitry 290) configured to generate a differential signal pair based on one or more signals of a second receive lane. In an embodiment, transmit circuitry and receive circuitry may be variously configurable—e.g. independent of one another across different signal lanes—for any of a plurality of operational modes, where each of the operational modes corresponds to a respective signaling type (e.g. electrical and/or optical). By way of illustration and not limitation, configuration logic 250 may configure DV 265, re-timer circuitry 260, TIA 275 and/or re-timer circuitry 270 to facilitate transmit/receive signal communication of one type. Alternatively or in addition, configuration logic 250 may configure DV 285, re-timer circuitry 280, TIA 295 and/or re-timer circuitry 290 to facilitate transmit/receive signal communication of another type. Accordingly, transceiver circuit 240 may be configured to facilitate—e.g. with respect to either or both of transmit communication and receive communications—any of a variety of combinations of differential electrical signaling, single-ended electrical signaling and/or optical signaling. In an embodiment, configuration of one or more signal lanes of transceiver circuit 240 may include bypassing some or all re-timer circuitry—as represented by the illustrative bypassing of re-timer circuitry 260, 270.

Certain embodiments variously provide for driver circuitry comprising an output stage to receive a differential signal pair and to provide one or more output signals representing information of the differential signal pair. Such driver circuitry may be configured to operate in any of a plurality of operating modes, each of which is to facilitate a respective one of electrical signal communication and optical signal communication. For example, such driver circuitry may be configured to select either one of a current mirror and a supply voltage for providing a respective signal to a node for operation of the output stage. Depending on a configured mode of the driver circuitry, operation of the output stage to provide the one or more output signals may be based on one—e.g. only one—of the current mirror and an alternate signal path providing a respective signal to facilitate such operation.

Figure 3:
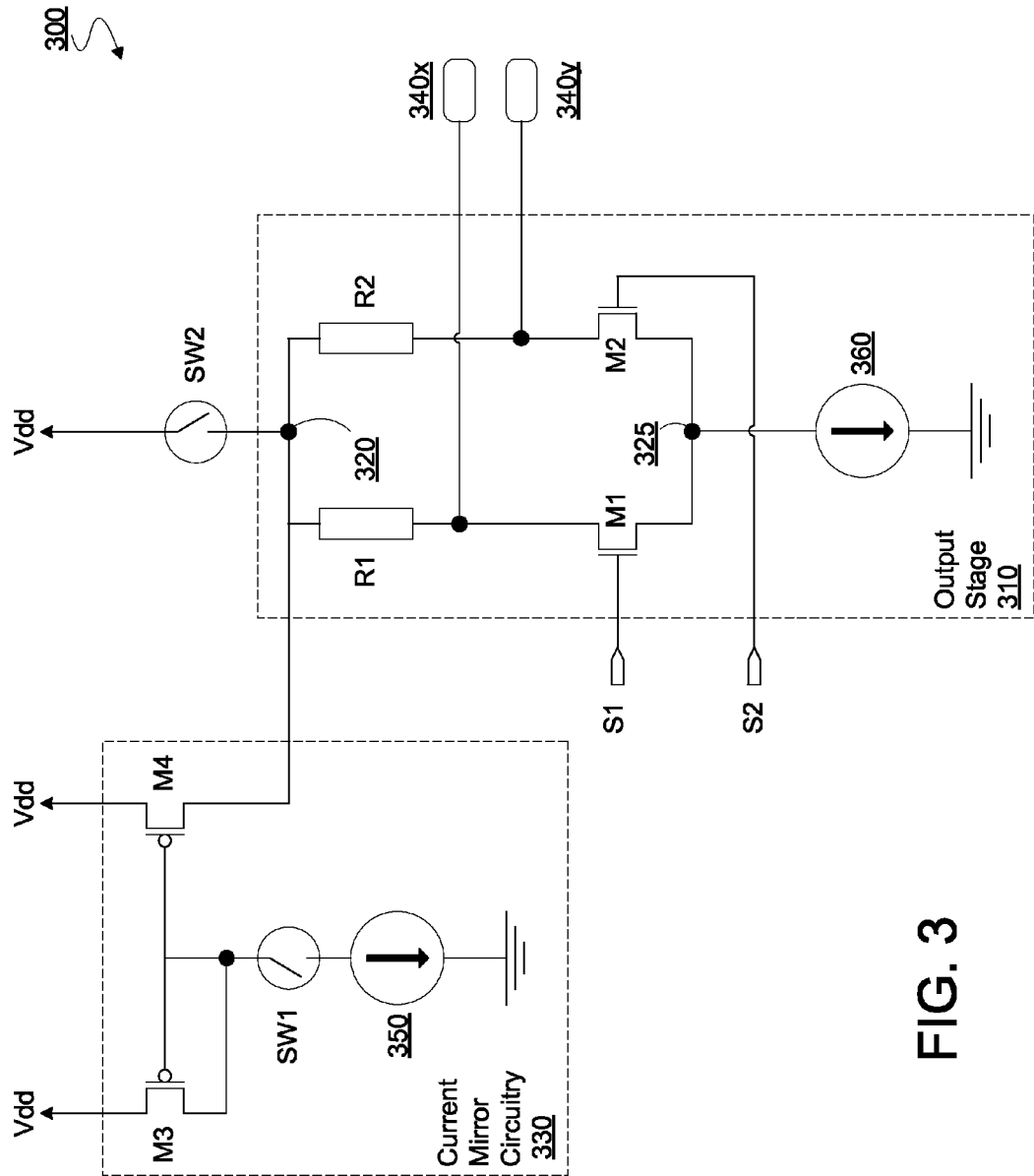
FIG. 3 is a circuit diagram illustrating elements of configurable driver circuitry according to an embodiment.

By way of illustration and not limitation, FIG. 3 illustrates elements of a configurable driver circuit 300 for processing a differential signal pair according to an embodiment. Driver circuit 300 may provide some of all of the functionality of DV 224, for example. In an embodiment, driver circuit 300 includes current mirror circuitry 330 and an output stage 310. During its operation, output stage 310 may receive a differential signal pair—as represented by the illustrative pair of signals S1, S2—and generate one or more output signals to represent information of the differential signal pair. Although certain embodiments are not limited in this regard, the signals S1, S2 may have a high speed data rate (e.g. 20 Gb/s) such as that which is provided by Intel Thunderbolt™ technology.

Output stage 310 may include legs coupled in parallel with one another—e.g. between a node 320 and a node 325. As used herein with reference to circuitry, a "leg" refers to a path between two nodes—e.g. where the leg includes circuit elements coupled in series with one another between such two nodes. By way of illustration and not limitation, a first leg of output stage 310 may include a load R1 and a transistor M1 to receive signal S1. A second leg of output stage 310 may include a load R2 and a transistor M2 to receive signal S2. R1 and R2 may each be son resistors, for example. However, certain embodiments are not limited in this regard, and R1 and R2 may have any of a variety of impedance values, according to implementation-specific details.

During operation of driver circuit 300, a current may be conducted between nodes 320, 325, wherein different respective portions of the current are variously directed to the first leg or the second leg in response to S1 and S2. One or more output signals may be sampled or otherwise provided based on such current portions being variously directed each to a respective one of the first leg and the second leg. For example, nodes of the first leg and second leg may include or couple to different respective contacts 340x, 340y, one or both of which may be available each for providing a respective output signal to facilitate a communication of information represented in S1, S2. Any of a variety of additional or alternative configurations of circuit elements may be implemented between nodes 320, 325 for variously conducting current along different legs based on differential signal pair S1, S2. In an embodiment, a current source 360 may be coupled between node 325 and a reference (e.g. ground) potential—e.g. to control modulation of the one or more output signals to be provided via contact 340x and/or contact 340y.

Configuration circuitry which is included in or coupled to driver circuit 300 may provide for selection of a first operational mode wherein a supply voltage—represented by the illustrative voltage Vdd—is to be provided via a signal path for operation of output stage 310 based on S1, S2. Such selection of the supply voltage may exclude current mirror circuitry 330 from providing a respective signal for operation of output stage 310. The first mode may facilitate electrical communications including, for example, either single-ended or differential exchanges of electrical signaling.

By way of illustration and not limitation, node 320 may be coupled to Vdd via a signal path which includes a switch SW2. In the configured first operational mode, such a signal path may be closed—e.g. wherein SW2 is in a closed (on) switch state—for node 320 to conduct current based on Vdd independent of current mirror 330. In such a first operational mode, current mirror circuitry 330 may be disabled from providing any current to node 320. For example, current mirror circuitry 330 may include transistors M3, M4 and a current source 350 which, for example, is switchedly coupled via a switch SW1 to the respective gate terminals of M3, M4. In the first mode, SW1 may be in an open (off) switch state to prevent a conducting of current by current source 350—e.g. at least though either or M3, M4. The first operational mode may also disable any other conducting of current by current source 350, although certain embodiments are not limited in this regard.

Alternatively or in addition, configuration circuitry included in or coupled to driver circuit 300 may provide for an alternative selection of a second mode wherein current mirror circuitry 330 is to provide current for operation of output stage 310 based on S1, S2. Such selection of current mirror circuitry 330 may exclude the signal path which includes SW2 from providing voltage for operation of output stage 310. By way of illustration and not limitation, in the second operational mode, SW2 may be in an open (off) switch state, and current mirror circuitry 330 may be enabled to provide a current to node 320. For example, in the second mode, SW1 may be in a closed (on) switch state to allow a conducting of current by current source 350 through M3. In response, M4 may output to node 320 a current signal mirroring that conducted by M3. In an embodiment, the second mode is to facilitate optical communications—e.g. wherein one of contacts 340x, 340y is to provide an output for driving a laser (not shown) to generate an optical signal.

The above-described first operational mode of driver circuit 300 may support, for example, operation of TC 120 in either of I/O hardware 110 and I/O hardware 140. Alternatively or in addition, the above-described second operational mode of driver circuit 300 may support, for example, operation of TC 120 in either of I/O hardware 170. For example, the respective functionality of contacts 340x, 340y may correspond to that of contacts 122x, 122y.

In an embodiment, current source 350 is to drive a current I1 which, for example, may be defined as:

$$I1 = I\text{bias} + 2 \cdot I\text{mod} \quad (1)$$

where Ibias is a bias current to provide a bias point for operating a laser and Imod is a modulation current to provide for modulation of an output signal with contact 340x and/or contact 340y. Alternatively or in addition, current source 360 may drive a current I2 which, for example, may be defined as:

$$I2 = 2 \cdot I\text{mod} \quad (2)$$

Although certain embodiments are not limited in this regard, Ibias may be in a range of 1 mA to 7 mA and Imod may be in a range of 0.5 mA to 10 mA. However, such levels of Ibias and Imod may vary significantly according to implementation-specific details. Configuration of the first operational mode of driver circuitry 300 may include setting a level of I2. Alternatively or in addition, configuration of the second operational mode of driver circuitry 300 may include setting respective levels for each of I1 and I2.

Figure 4:
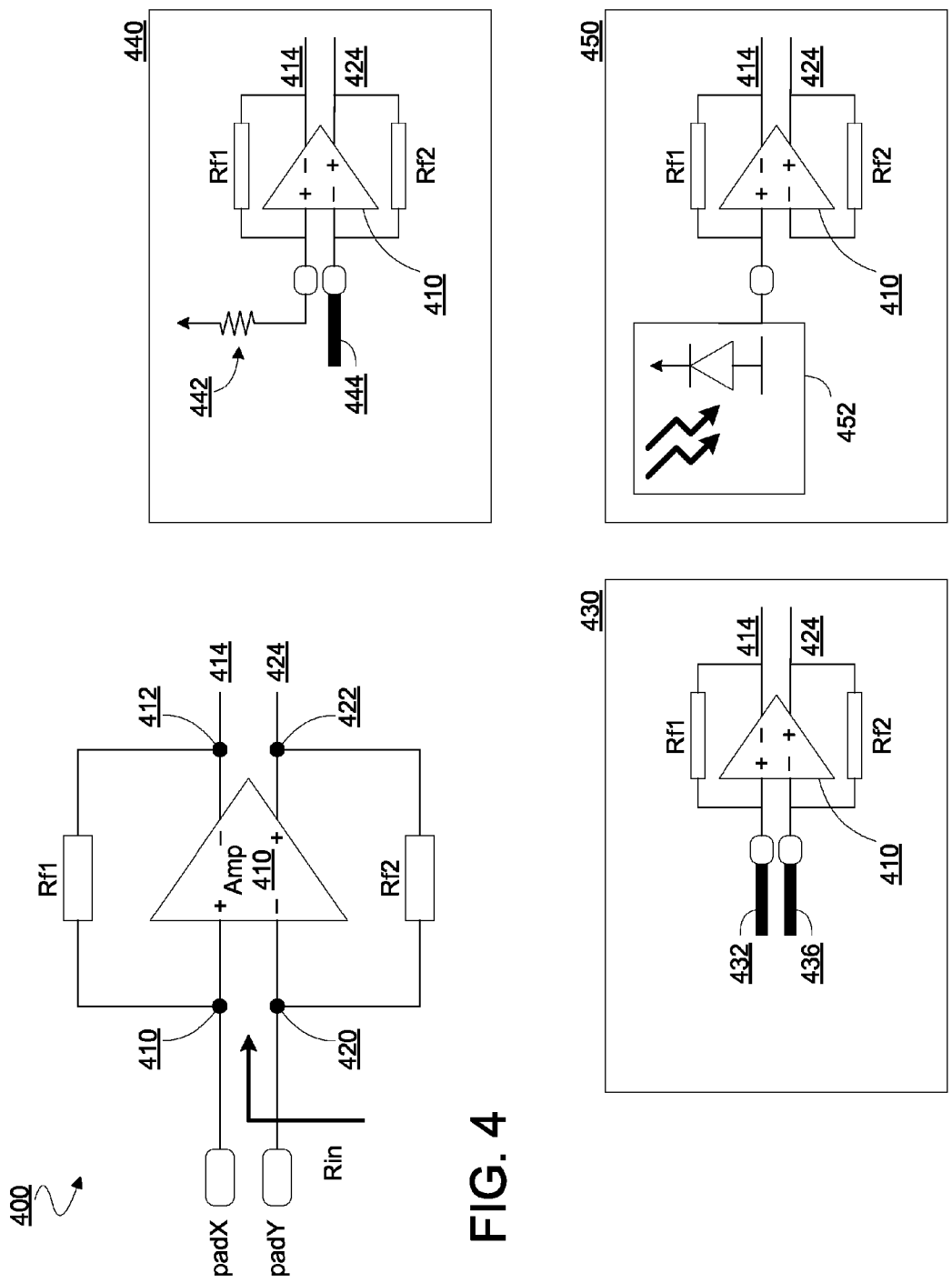
FIG. 4 is a circuit diagram illustrating elements of configurable receiver circuitry according to an embodiment.

FIG. 4 illustrates elements of a receiver circuit 400 of a configurable transceiver circuit according to an embodiment. Receiver circuit 400 may be variously adapted to receive any of a single-ended electrical signal, a differential signal pair and an output from a photodetector based on a received optical signal. For example, receiver circuit 400 may include some or all of the features of TIA 234.

In an embodiment, receiver circuit 400 comprises a differential amplifier 410 coupled to receive one or more signals, where differential amplifier 410 is to output a differential signal based on the received one or more signals. By way of illustration and not limitation, a signal from a contact padx may be provided via a node 410 to a first input of differential amplifier 410. Alternatively or in addition, a signal from a contact pady may be provided via a node 420 to a second input of differential amplifier 410. Contacts padx, pady may be variously coupled to I/O hardware—e.g. including various ones of contacts, 124x, 124y, 152 or a photodetector—to receive such one or more signals. Based on the one or more signals provided via contacts padx, pady, outputs of differential amplifier 410 may provide signals 414, 424 of a differential signal pair at respective nodes 412, 422.

In an embodiment, generation of signals 414, 424 may be based on feedback through a first load Rf1 between nodes 412, 410 and/or feedback through a second load Rf2 between nodes 422, 420. Loads Rf1, Rf2 may be equal to one another, in one embodiment. A gain of differential amplifier 410 and/or the respective values of Rf1, Rf2 may be selected for an input impedance Rin of receiver circuit 400 to provide, for example, a 50Ω load to match the driving source impedance of a single-ended use case. Alternatively, such gain and resistance values may provide a 100Ω differential load for impedance matching in a differential signaling use case. In an embodiment, one or each of Rf1 and Rf2 includes a field effect transistor or other circuit element to provide for tuning of feedback across differential amplifier 410. Such tuning of Rf1 and/or Rf2 may be adapted from conventional structures to provide for impedance tuning.

To illustrate features of certain embodiments, FIG. 4 further shows various configurations 430, 440, 450 of receiver 400, each for the generation of a respective differential signal pair. In configuration 430, contacts padx, pady are coupled for receiver circuit 400 to receive via input signal lines 432, 436 different respective signals of an input differential signal pair. Such a configuration 430 may, for example, provide for receiver functionality which is reciprocal to the transmit functionality represented in system 100a.

In configuration 440, contact pady is coupled for receiver circuit 400 to receive via an input signal line 444 a single-ended signal. By contrast, padx may be coupled in configuration 440 to a resistor 442 which provides a termination load to facilitate single-ended communication using contact pady. Such a configuration 440 may, for example, provide for receiver functionality which is reciprocal to the transmit functionality represented in system 100b. In configuration 450, contact padx is coupled for receiver circuit 400 to receive via a signal output from a photodetector 452 based on an optical signal. By contrast, pady may be merely coupled to differential amplified 410—e.g. without also being coupled to provide any signal from a source external to differential amplifier 410. Such a configuration 450 may, for example, provide for receiver functionality which is reciprocal to the transmit functionality represented in system 100c.

Figure 5:
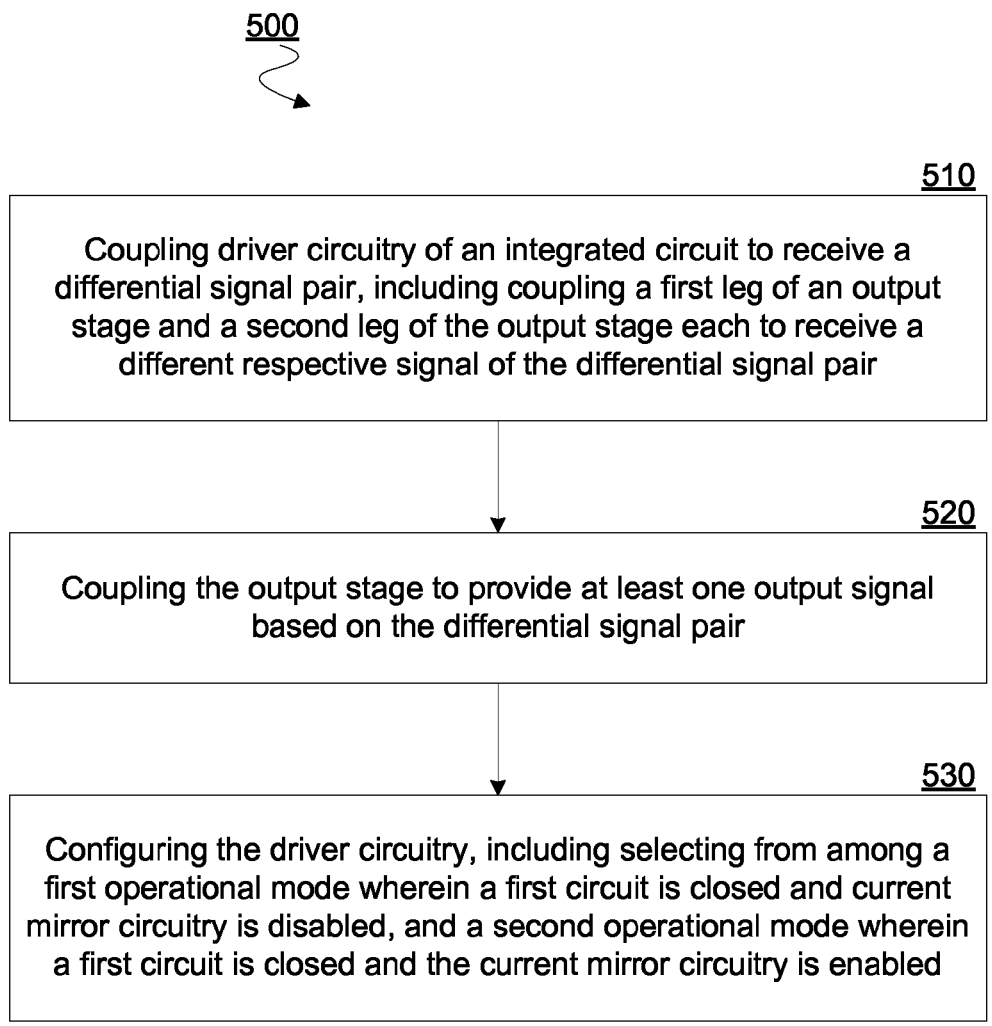
FIG. 5 is a flow diagram illustrating elements of a method for configuring transceiver circuitry according to an embodiment.

FIG. 5 illustrates elements of a method 500 for providing transceiver functionality according to an embodiment. Method 500 may be performed to provide for operation of a configurable transceiver circuit such as TC 120, for example. In an embodiment, method 500 includes, at 510 coupling driver circuitry of an integrated circuit to receive a differential signal pair. The driver circuitry may comprise, for example, current mirror circuitry and an output stage comprising a first leg and a second leg which is coupled in parallel with the first leg between a first node and a second node (e.g. nodes 320, 325, respectively). In some embodiments, the output stage may further comprises a current source, such as current source 360, to draw current from the second node. The coupling at 510 may include coupling the first leg and the second leg of the output stage each to receive a different respective signal of the differential signal pair.

Method 500 may further comprise, at 520, coupling the output stage to provide at least one output signal based on the differential signal pair. For example, the coupling at 520 may include one or both of coupling a node of the first leg to a first output contact and coupling a node of the second leg to a second output contact. For example, the first leg and second leg may each be coupled to provide a different respective signal of an output differential signal pair. Alternatively, the first leg may be coupled to provide a single-ended output signal—e.g. wherein the second leg is coupled to a termination load to facilitate communication of the single-ended output signal. Alternatively, one such leg may be coupled to provide a signal for driving a laser, where the other leg is not directly coupled to any load or output external to the output stage.

In an embodiment, method 500 further comprises, at 530, configuring the driver circuitry for an operational mode which facilitates providing of the at least one output signal. For example, the configuring at 530 may include selecting from among a first operational mode and a second operational mode of the driver circuitry. In the first operational mode, a first circuit is closed—the first circuit coupled between the first node and a supply voltage—and the current mirror circuitry is disabled from providing a current signal to the first node. In the second operational mode, the first circuit is instead open, and the current mirror circuitry is configured to provide the current signal to the first node.

Figure 6:
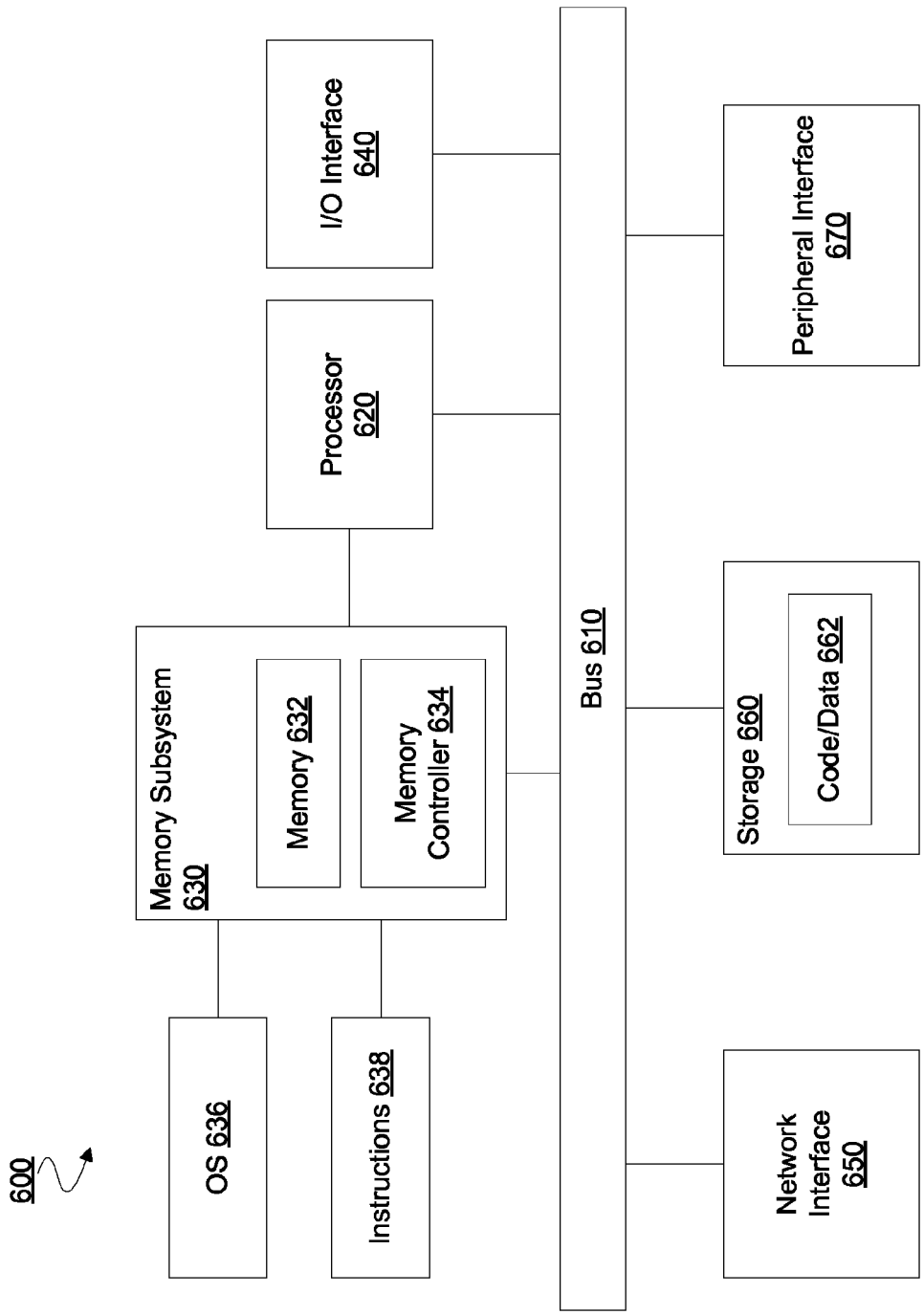
FIG. 6 is a functional block diagram illustrating elements of a computer system for communicating signals according to an embodiment.

FIG. 6 is a block diagram of an embodiment of a computing system in which signal communications may be implemented. System 600 represents a computing device in accordance with any embodiment described herein, and may be a laptop computer, a desktop computer, a server, a gaming or entertainment control system, a scanner, copier, printer, or other electronic device. System 600 may include processor 620, which provides processing, operation management, and execution of instructions for system 600. Processor 620 may include any type of microprocessor, central processing unit (CPU), processing core, or other processing hardware to provide processing for system 600. Processor 620 controls the overall operation of system 600, and may be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 630 represents the main memory of system 600, and provides temporary storage for code to be executed by processor 620, or data values to be used in executing a routine. Memory subsystem 630 may include one or more memory devices such as read-only memory (ROM), flash memory, one or more varieties of random access memory (RAM), or other memory devices, or a combination of such devices. Memory subsystem 630 stores and hosts, among other things, operating system (OS) 636 to provide a software platform for execution of instructions in system 600. Additionally, other instructions 638 are stored and executed from memory subsystem 630 to provide the logic and the processing of system 600. OS 636 and instructions 638 are executed by processor 620.

Memory subsystem 630 may include memory device 632 where it stores data, instructions, programs, or other items. In one embodiment, memory subsystem includes memory controller 634, which supports access to memory device 632 by processor 620. Processor 620 and memory subsystem 630 are coupled to bus/bus system 610. Bus 610 is an abstraction that represents any one or more separate physical buses, communication lines/interfaces, and/or point-to-point connections, connected by appropriate bridges, adapters, and/or controllers. Therefore, bus 610 may include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 610 may also correspond to interfaces in network interface 650.

System 600 may also include one or more input/output (I/O) interface(s) 640, network interface 650, one or more internal mass storage device(s) 660, and peripheral interface 670 coupled to bus 610. I/O interface 640 may include one or more interface components through which a user interacts with system 600 (e.g., video, audio, and/or alphanumeric interfacing). Network interface 650 provides system 600 the ability to communicate with remote devices (e.g., servers, other computing devices) over one or more networks. Network interface 650 may include an Ethernet adapter, wireless interconnection components, USB (universal serial bus), or other wired or wireless standards-based or proprietary interfaces.

Storage 660 may be or include any conventional medium for storing large amounts of data in a nonvolatile manner, such as one or more magnetic, solid state, or optical based disks, or a combination. Storage 660 holds code or instructions and data 662 in a persistent state (i.e., the value is retained despite interruption of power to system 600). Storage 660 may be generically considered to be a "memory," although memory 630 is the executing or operating memory to provide instructions to processor 620. Whereas storage 660 is nonvolatile, memory 630 may include volatile memory (i.e., the value or state of the data is indeterminate if power is interrupted to system 600).

Peripheral interface 670 may include any hardware interface not specifically mentioned above. Peripherals refer generally to devices that connect dependently to system 600. A dependent connection is one where system 600 provides the software and/or hardware platform on which operation executes, and with which a user interacts.

Figure 7:
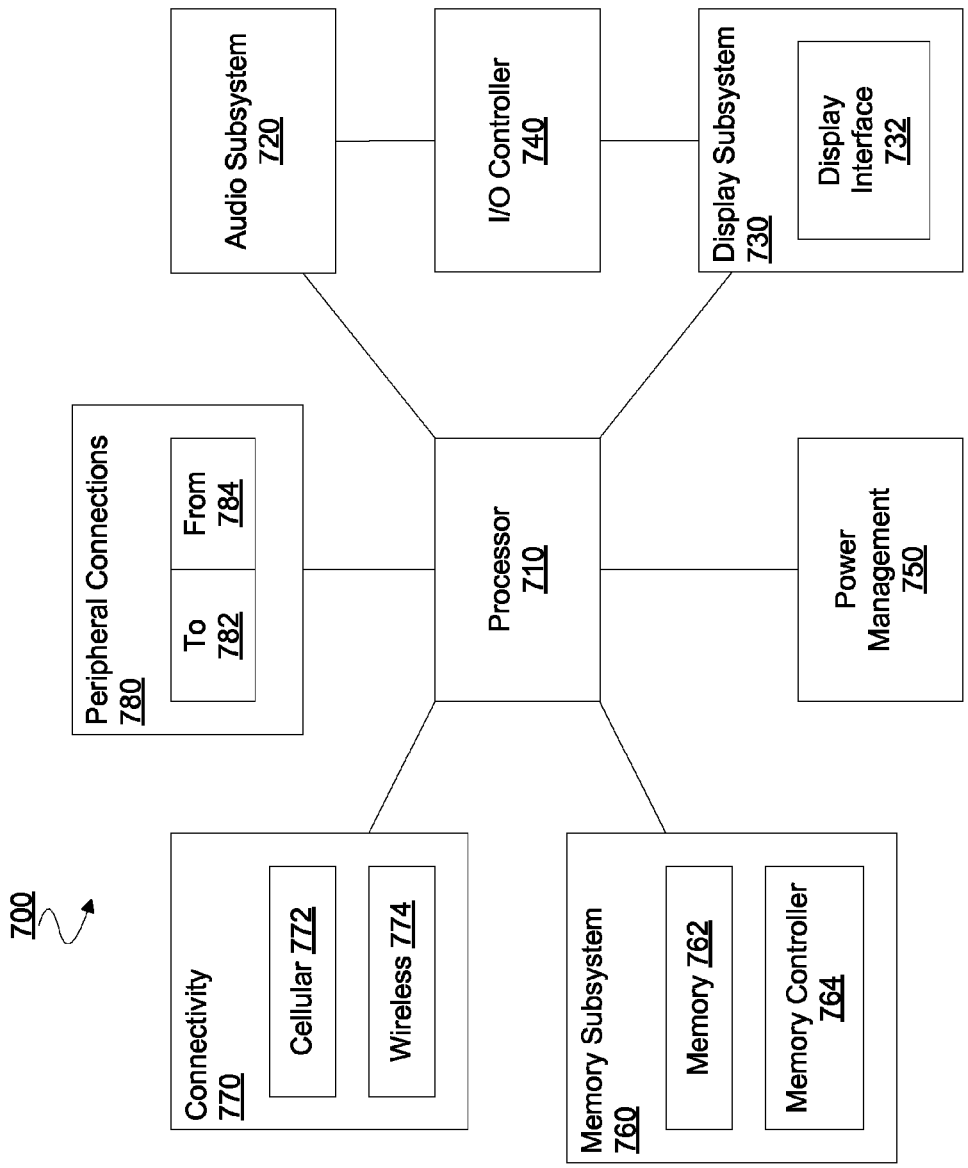
FIG. 7 is a functional block diagram illustrating elements of a mobile device for communicating signals according to an embodiment.

FIG. 7 is a block diagram of an embodiment of a mobile device in which signal communications may be implemented. Device 700 represents a mobile computing device, such as a computing tablet, a mobile phone or smartphone, a wireless-enabled e-reader, or other mobile device. It will be understood that certain of the components are shown generally, and not all components of such a device are shown in device 700.

Device 700 may include processor 710, which performs the primary processing operations of device 700. Processor 710 may include one or more physical devices, such as microprocessors, application processors, microcontrollers, programmable logic devices, or other processing means. The processing operations performed by processor 710 include the execution of an operating platform or operating system on which applications and/or device functions are executed. The processing operations include operations related to I/O (input/output) with a human user or with other devices, operations related to power management, and/or operations related to connecting device 700 to another device. The processing operations may also include operations related to audio I/O and/or display I/O.

In one embodiment, device 700 includes audio subsystem 720, which represents hardware (e.g., audio hardware and audio circuits) and software (e.g., drivers, codecs) components associated with providing audio functions to the computing device. Audio functions may include speaker and/or headphone output, as well as microphone input. Devices for such functions may be integrated into device 700, or connected to device 700. In one embodiment, a user interacts with device 700 by providing audio commands that are received and processed by processor 710.

Display subsystem 730 represents hardware (e.g., display devices) and software (e.g., drivers) components that provide a visual and/or tactile display for a user to interact with the computing device. Display subsystem 730 may include display interface 732, which may include the particular screen or hardware device used to provide a display to a user. In one embodiment, display interface 732 includes logic separate from processor 710 to perform at least some processing related to the display. In one embodiment, display subsystem 730 includes a touchscreen device that provides both output and input to a user.

I/O controller 740 represents hardware devices and software components related to interaction with a user. I/O controller 740 may operate to manage hardware that is part of audio subsystem 720 and/or display subsystem 730. Additionally, I/O controller 740 illustrates a connection point for additional devices that connect to device 700 through which a user might interact with the system. For example, devices that may be attached to device 700 might include microphone devices, speaker or stereo systems, video systems or other display device, keyboard or keypad devices, or other I/O devices for use with specific applications such as card readers or other devices.

As mentioned above, I/O controller 740 may interact with audio subsystem 720 and/or display subsystem 730. For example, input through a microphone or other audio device may provide input or commands for one or more applications or functions of device 700. Additionally, audio output may be provided instead of or in addition to display output. In another example, if display subsystem includes a touchscreen, the display device also acts as an input device, which may be at least partially managed by I/O controller 740. There may also be additional buttons or switches on device 700 to provide I/O functions managed by I/O controller 740.

In one embodiment, I/O controller 740 manages devices such as accelerometers, cameras, light sensors or other environmental sensors, gyroscopes, global positioning system (GPS), or other hardware that may be included in device 700. The input may be part of direct user interaction, as well as providing environmental input to the system to influence its operations (such as filtering for noise, adjusting displays for brightness detection, applying a flash for a camera, or other features).

In one embodiment, device 700 includes power management 750 that manages battery power usage, charging of the battery, and features related to power saving operation. Memory subsystem 760 may include memory device(s) 762 for storing information in device 700. Memory subsystem 760 may include nonvolatile (state does not change if power to the memory device is interrupted) and/or volatile (state is indeterminate if power to the memory device is interrupted) memory devices. Memory 760 may store application data, user data, music, photos, documents, or other data, as well as system data (whether long-term or temporary) related to the execution of the applications and functions of system 700.

In one embodiment, memory subsystem 760 includes memory controller 764 (which could also be considered part of the control of system 700, and could potentially be considered part of processor 710). Memory controller 764 may exchange communications with memory 762 via a command/address bus (not shown). In an embodiment, memory controller 764 sends a commands to variously access data in memory 762.

Connectivity 770 may include hardware devices (e.g., wireless and/or wired connectors and communication hardware) and software components (e.g., drivers, protocol stacks) to enable device 700 to communicate with external devices. The device could be separate devices, such as other computing devices, wireless access points or base stations, as well as peripherals such as headsets, printers, or other devices.

Connectivity 770 may include multiple different types of connectivity. To generalize, device 700 is illustrated with cellular connectivity 772 and wireless connectivity 774. Cellular connectivity 772 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 774 refers to wireless connectivity that is not cellular, and may include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 780 include hardware interfaces and connectors, as well as software components (e.g., drivers, protocol stacks) to make peripheral connections. It will be understood that device 700 could both be a peripheral device ("to" 782) to other computing devices, as well as have peripheral devices ("from" 784) connected to it. Device 700 commonly has a "docking" connector to connect to other computing devices for purposes such as managing (e.g., downloading and/or uploading, changing, synchronizing) content on device 700. Additionally, a docking connector may allow device 700 to connect to certain peripherals that allow device 700 to control content output, for example, to audiovisual or other systems.

In addition to a proprietary docking connector or other proprietary connection hardware, device 700 may make peripheral connections 780 via common or standards-based connectors. Common types may include a Universal Serial Bus (USB) connector (which may include any of a number of different hardware interfaces), DisplayPort including MiniDisplayPort (MDP), High Definition Multimedia Interface (HDMI), Firewire, or other type.

In one implementation, an integrated circuit comprises first driver circuitry including first current mirror circuitry and a first output stage comprising a first leg and a second leg in parallel with the first leg between a first node and a second node, the first leg and the second leg each to receive a respective signal of a first differential signal pair, and a first current source to draw current from the second node, wherein the first output stage to provide at least one output signal based on the first differential signal pair. The integrated circuit further comprises configuration logic to select from among a first operational mode of the first driver circuitry wherein a first circuit is closed, the first circuit coupled between the first node and a supply voltage, wherein the first current mirror circuitry is disabled from providing a first current signal to the first node, and a second operational mode of the first driver circuitry wherein the first circuit is open, the first current mirror circuitry is configured to provide the first current signal to the first node.

In an embodiment, the current mirror circuitry includes a second current source and a first transistor, and wherein the first operational mode includes the second current source being switchedly decoupled from the first transistor. In another embodiment, the current mirror circuitry further comprises a second transistor, wherein the second mode includes the second current source switchedly coupled to drive a first current signal with the first transistor, and the second transistor to provide to the first node a second current signal mirroring the first current signal. In another embodiment, the second mode includes the second current source to drive the first current signal to control one of a bias of the at least one output signal and a modulation of the at least one output signal. In another embodiment, the first current source is to draw current from the second node to control a modulation of the at least one output signal.

In another embodiment, the integrated circuit further comprises a first receiver circuit including a differential amplifier including a first input and a second input, wherein the first input and the second input to receive at least one input signal, a first feedback path coupling a first output of the differential amplifier to the first input, and a second feedback path coupling a second output of the differential amplifier to the second input, wherein, based on the at least one input signal, the differential amplifier to provide a second differential signal pair with the first output and the second output. In another embodiment, the integrated circuit further comprises second driver circuitry including second current mirror circuitry, and a second output stage to receive a second differential signal pair, wherein, independent of selection from among the first operational mode of the first driver circuitry and the second operational mode of the first driver circuitry, the configuration logic further to select an operational mode of the second driver circuitry to provide at least one output signal based on the second differential signal pair.

In another implementation, a method comprises coupling first driver circuitry of an integrated circuit to receive a first differential signal pair. The first driver circuitry includes first current mirror circuitry and a first output stage comprising a first leg and a second leg in parallel with the first leg between a first node and a second node. The first driver circuitry further includes a first current source to draw current from the second node, wherein coupling the first driver circuitry to receive the first differential signal pair includes coupling the first leg and the second leg each to receive a different respective signal of the first differential signal pair. The method further comprises coupling the first output stage to provide at least one output signal based on the first differential signal pair, and configuring the first driver circuitry, including selecting from among a first operational mode of the first driver circuitry wherein a first circuit is closed, the first circuit coupled between the first node and a supply voltage, and wherein the first current mirror circuitry is disabled from providing a first current signal to the first node, and a second operational mode of the first driver circuitry wherein the first circuit is open and the first current mirror circuitry is configured to provide the first current signal to the first node.

In an embodiment, the current mirror circuitry includes a second current source and a first transistor, wherein the first operational mode includes the second current source being switchedly decoupled from the first transistor. In another embodiment, the current mirror circuitry further comprises a second transistor, wherein the second mode includes the second current source switchedly coupled to drive a first current signal with the first transistor, and the second transistor is to provide to the first node a second current signal mirroring the first current signal. In another embodiment, the second mode includes the second current source to drive the first current signal to control one of a bias of the at least one output signal and a modulation of the at least one output signal. In another embodiment, the first current source is to draw current from the second node to control a modulation of the at least one output signal. In another embodiment, the integrated circuit further comprises further comprises a first receiver circuit including a differential amplifier including a first input and a second input, wherein the first input and the second input to receive at least one input signal, a first feedback path coupling a first output of the differential amplifier to the first input, and a second feedback path coupling a second output of the differential amplifier to the second input, wherein, based on the at least one input signal, the differential amplifier is to provide a second differential signal pair with the first output and the second output.

In another embodiment, the integrated circuit further comprises second driver circuitry including second current mirror circuitry, and a second output stage to receive a second differential signal pair, wherein, the method further comprises, independent of selecting from among the first operational mode of the first driver circuitry and the second operational mode of the first driver circuitry, selecting an operational mode of the second driver circuitry to provide at least one output signal based on the second differential signal pair. In another embodiment, wherein selecting the operational mode of the second driver circuitry includes selecting from among a third operational mode corresponding to the first operational mode, and a fourth operational mode corresponding to the second operational mode. In another embodiment, wherein the first driver circuitry is configured for the first operational mode and the second driver circuitry is configured for the fourth operational mode.

In another implementation, a system comprises a printed circuit board comprising input/output contacts. The system further comprises an integrated circuit coupled to the printed circuit board, the integrated circuit comprising first driver circuitry including first current mirror circuitry, and a first output stage comprising a first leg and a second leg in parallel with the first leg between a first node and a second node, the first leg and the second leg each to receive a respective signal of a first differential signal pair, and a first current source to draw current from the second node, wherein the first output stage to provide at least one output signal to the input/output contacts based on the first differential signal pair. Configuration logic of integrated circuit is set to select from among for one of a first operational mode of the first driver circuitry wherein a first circuit is closed, the first circuit coupled between the first node and a supply voltage, and wherein the first current mirror circuitry is disabled from providing a first current signal to the first node, and a second operational mode of the first driver circuitry wherein the first circuit is open and the first current mirror circuitry is configured to provide the first current signal to the first node.

In an embodiment, the current mirror circuitry includes a second current source and a first transistor, wherein the first operational mode includes the second current source being switchedly decoupled from the first transistor. In another embodiment, the current mirror circuitry further comprises a second transistor, wherein the second mode includes the second current source switchedly coupled to drive a first current signal with the first transistor, and the second transistor to provide to the first node a second current signal mirroring the first current signal. In another embodiment, the second mode includes the second current source to drive the first current signal to control one of a bias of the at least one output signal and a modulation of the at least one output signal. In another embodiment, the first current source is to draw current from the second node to control a modulation of the at least one output signal.

In another embodiment, the integrated circuit further comprises a first receiver circuit including a differential amplifier including a first input and a second input, wherein the first input and the second input to receive at least one input signal, a first feedback path coupling a first output of the differential amplifier to the first input, and a second feedback path coupling a second output of the differential amplifier to the second input, wherein, based on the at least one input signal, the differential amplifier to provide a second differential signal pair with the first output and the second output. In another embodiment, the integrated circuit further comprises second driver circuitry including second current mirror circuitry, and a second output stage to receive a second differential signal pair, wherein, independent of selection from among the first operational mode of the first driver circuitry and the second operational mode of the first driver circuitry, the configuration logic further to select an operational mode of the second driver circuitry to provide at least one output signal based on the second differential signal pair.

Techniques and architectures for signal communication are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. An integrated circuit comprising:
   first driver circuitry including first current mirror circuitry and a first output stage comprising a first leg and a second leg in parallel with the first leg between a first node and a second node, the first leg and the second leg each to receive a respective signal of a first differential signal pair, and a first current source to draw current from the second node, wherein the first output stage to provide at least one output signal based on the first differential signal pair, the first current mirror circuitry including a second current source and a first transistor; and configuration logic to select from among:

a first operational mode of the first driver circuitry wherein a first circuit is closed, the first circuit coupled between the first node and a supply voltage, wherein the first current mirror circuitry is disabled from providing a first current signal to the first node, wherein the first operational mode includes the second current source being switchedly decoupled from the first transistor; and a second operational mode of the first driver circuitry wherein the first circuit is open, the first current mirror circuitry is configured to provide the first current signal to the first node.

2. The integrated circuit of claim 1, wherein first current mirror circuitry further comprises a second transistor, wherein the second mode includes the second current source switchedly coupled to drive a first current signal with the first transistor, and the second transistor to provide to the first node a second current signal mirroring the first current signal.

3. The integrated circuit of claim 2, wherein the second mode includes the second current source to drive the first current signal to control one of a bias of the at least one output signal and a modulation of the at least one output signal.

4. The integrated circuit of claim 1, wherein the first current source to draw current from the second node to control a modulation of the at least one output signal.

5. The integrated circuit of claim 1, further comprising a first receiver circuit including:

a differential amplifier including a first input and a second input, wherein the first input and the second input to receive at least one input signal;

a first feedback path coupling a first output of the differential amplifier to the first input; and a second feedback path coupling a second output of the differential amplifier to the second input;

wherein, based on the at least one input signal, the differential amplifier to provide a second differential signal pair with the first output and the second output.

6. The integrated circuit of claim 1, further comprising: second driver circuitry including:

second current mirror circuitry; and a second output stage to receive a second differential signal pair;

wherein, independent of selection from among the first operational mode of the first driver circuitry and the second operational mode of the first driver circuitry, the configuration logic further to select an operational mode of the second driver circuitry to provide at least one output signal based on the second differential signal pair.

7. A method comprising:

coupling first driver circuitry of an integrated circuit to receive a first differential signal pair, the first driver circuitry including first current mirror circuitry and a first output stage comprising a first leg, a second leg in parallel with the first leg between a first node and a second node, and a first current source to draw current from the second node, first current mirror circuitry including a second current source and a first transistor, wherein coupling the first driver circuitry to receive the first differential signal pair includes coupling the first leg and the second leg each to receive a different respective signal of the first differential signal pair;

coupling the first output stage to provide at least one output signal based on the first differential signal pair;

configuring the first driver circuitry, including selecting from among:

a first operational mode wherein a first circuit is closed, the first circuit coupled between the first node and a supply voltage, and wherein the first current mirror circuitry is disabled from providing a first current signal to the first node, wherein the first operational mode includes the second current source being switchedly decoupled from the first transistor; and a second operational mode wherein the first circuit is open and the first current mirror circuitry is configured to provide the first current signal to the first node.

8. The method of claim 7, wherein first current mirror circuitry further comprises a second transistor, wherein the second mode includes the second current source switchedly coupled to drive a first current signal with the first transistor, and the second transistor to provide to the first node a second current signal mirroring the first current signal.

9. The method of claim 8, wherein the second mode includes the second current source to drive the first current signal to control one of a bias of the at least one output signal and a modulation of the at least one output signal.

10. The method of claim 7, wherein the first current source to draw current from the second node to control a modulation of the at least one output signal.

11. The method of claim 7, further comprising coupling a first receiver circuit of the integrated circuit to receive a second differential signal pair, the first receiver circuit including:

a differential amplifier including a first input and a second input, wherein the first input and the second input to receive at least one input signal;

a first feedback path coupling a first output of the differential amplifier to the first input; and a second feedback path coupling a second output of the differential amplifier to the second input;

wherein, based on the at least one input signal, the differential amplifier to provide a second differential signal pair with the first output and the second output.

12. A system comprising:

a printed circuit board comprising input/output contacts; and an integrated circuit coupled to the printed circuit board, the integrated circuit comprising first driver circuitry including first current mirror circuitry and a first output stage comprising a first leg and a second leg in parallel with the first leg between a first node and a second node, the first leg and the second leg each to receive a respective signal of a first differential signal pair, and a first current source to draw current from the second node, wherein the first output stage to provide at least one output signal to the input/output contacts based on the first differential signal pair, first current mirror circuitry including a second current source and a first transistor;

wherein configuration logic of integrated circuit is set for selection from among:

a first operational mode wherein a first circuit is closed, the first circuit coupled between the first node and a supply voltage, and wherein the first current mirror circuitry is disabled from providing a first current signal to the first node, wherein the first operational mode includes the second current source being switchedly decoupled from the first transistor; and a second operational mode wherein the first circuit is open and the first current mirror circuitry is configured to provide the first current signal to the first node.

13. The system of claim 12, wherein first current mirror circuitry further comprises a second transistor, wherein the second mode includes the second current source switchedly coupled to drive a first current signal with the first transistor, and the second transistor to provide to the first node a second current signal mirroring the first current signal.

14. The system of claim 13, wherein the second mode includes the second current source to drive the first current signal to control one of a bias of the at least one output signal and a modulation of the at least one output signal.

15. The system of claim 12, wherein the first current source to draw current from the second node to control a modulation of the at least one output signal.

16. The system of claim 12, further comprising a first receiver circuit including:

a differential amplifier including a first input and a second input, wherein the first input and the second input to receive at least one input signal;

a first feedback path coupling a first output of the differential amplifier to the first input; and a second feedback path coupling a second output of the differential amplifier to the second input;

wherein, based on the at least one input signal, the differential amplifier to provide a second differential signal pair with the first output and the second output.

17. The system of claim 12, further comprising second driver circuitry including:

second current mirror circuitry; and a second output stage to receive a second differential signal pair;

wherein, independent of selection from among the first operational mode of the first driver circuitry and the second operational mode of the first driver circuitry, the configuration logic further to select an operational mode of the second driver circuitry to provide at least one output signal based on the second differential signal pair.

* * * * *